(12) United States Patent
Shimeno et al.

(10) Patent No.: US 8,222,365 B2
(45) Date of Patent: Jul. 17, 2012

(54) POLYAMIDEIMIDE RESIN, AS WELL AS A COLORLESS AND TRANSPARENT FLEXIBLE METAL-CLAD LAMINATE AND CIRCUIT BOARD OBTAINED THEREFROM

(75) Inventors: Katsuya Shimeno, Shiga (JP); Takeshi Ito, Shiga (JP); Tomohiro Aoyama, Shiga (JP); Akira Nishimoto, Shiga (JP); Shoko Nagata, Shiga (JP); Tomoharu Kurita, Shiga (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 445 days.

(21) Appl. No.: 12/518,302

(22) PCT Filed: Dec. 3, 2007

(86) PCT No.: PCT/JP2007/073292
§ 371 (c)(1),
(2), (4) Date: Jun. 9, 2009

(87) PCT Pub. No.: WO2008/072495
PCT Pub. Date: Jun. 19, 2008

(65) Prior Publication Data
US 2010/0018756 A1  Jan. 28, 2010

(30) Foreign Application Priority Data

Dec. 12, 2006  (JP) ................. 2006-334860

(51) Int. Cl.
*C08G 18/34* (2006.01)
*C08G 73/14* (2006.01)
*B32B 27/28* (2006.01)

(52) U.S. Cl. ........ 528/60; 428/473.5; 528/350; 528/363

(58) Field of Classification Search ............... 428/473.5; 528/60, 350, 363
See application file for complete search history.

(56) References Cited

U.S. PATENT DOCUMENTS

| | | | | |
|---|---|---|---|---|
| 3,661,863 A * | 5/1972 | Campbell | ...... | 528/342 |
| 3,709,862 A * | 1/1973 | Minami | ...... | 525/436 |
| 4,028,476 A * | 6/1977 | Kleinschmidt et al. | ...... | 428/220 |
| 4,736,008 A * | 4/1988 | Kouno et al. | ...... | 528/57 |
| 5,412,108 A * | 5/1995 | Fisher | ...... | 549/245 |
| 2003/0091842 A1 * | 5/2003 | Murakami et al. | ...... | 428/473.5 |

FOREIGN PATENT DOCUMENTS

| | | |
|---|---|---|
| JP | 56-093731 | 7/1981 |
| JP | 04-288344 | 10/1992 |
| JP | 05-059174 | 3/1993 |
| JP | 07-010993 | 1/1995 |
| JP | 2002-161136 | 6/2002 |
| JP | 2005-179565 | 7/2005 |
| JP | 2006-028073 | 2/2006 |
| WO | WO 2006/129771 | 12/2006 |
| WO | WO 2007/108472 | 9/2007 |

* cited by examiner

*Primary Examiner* — Callie Shosho
*Assistant Examiner* — John Freeman
(74) *Attorney, Agent, or Firm* — Fish & Richardson P.C.

(57) ABSTRACT

This disclosure relates to a polyamideimide resin containing a structure represented by formula (1):

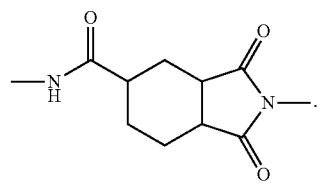

(1)

18 Claims, No Drawings

POLYAMIDEIMIDE RESIN, AS WELL AS A COLORLESS AND TRANSPARENT FLEXIBLE METAL-CLAD LAMINATE AND CIRCUIT BOARD OBTAINED THEREFROM

TECHNICAL FIELD OF THE INVENTION

The present invention relates to a polyamideimide resin having excellent heat resistance and flexibility together with sufficient colorless transparency, a flexible metal-clad laminate and a colorless and transparent flexible printed circuit board using the same.

BACKGROUND ART

As to a flexible metal-clad laminate which is usually used as a material for a flexible printed circuit board, a three-layered flexible metal-clad laminate comprising all-aromatic polyimide film, adhesive and copper foil has been generally known and has been used mostly in general-purpose use. On the other hand, a two-layered flexible metal-clad laminate constituted only from polyimide and copper foil without an adhesive has been also known and that which is called a metallizing type where copper is directly formed by a metal plating to a polyimide film, that which is called a casting type where a polyimide varnish is applied to copper foil and that which is called a laminated type where a thermoplastic polyimide and copper foil are adhered by means of thermal pressure connection have been known. They have been widely used at present as the parts for electronic instruments where flexibility and small occupying space are required being exemplified by a device-installed substrate for a display apparatus such as liquid crystal display and plasma display and by a connecting cable between substrates and operation switch substrate for mobile phones, digital cameras, portable game machines, etc.

Moreover, as a development of bendable paper displays and the like in recent years, necessity for a transparent film substrate in place of the current glass substrate is increasing and application of a flexible printed circuit board as a transparent film substrate is being considered.

In order to apply a flexible printed circuit board to such a use, it is necessary that a flexible printed circuit board and a flexible metal-clad laminate which is a raw material therefor has a colorless transparency like glass in addition to the conventional heat resistance and flexibility. Unfortunately however, the commercially available all-aromatic polyimide (such as APICAL manufactured by Kaneka Corporation) which is currently used for a flexible printed circuit board and also for a flexible metal-clad laminate which is a raw material therefor at present is colored in yellowish brown due to intramolecular and intermolecular formation of a charge-transfer complex and have difficulty in applying to the use where colorless transparency is necessary such as a transparent film substrate.

It has been known that, in order to make polyimide colorless and transparent, an alicyclic diamine or an aliphatic diamine is used as a diamine component to suppress the formation of intramolecular and intermolecular charge-transfer complex. For example, in Japanese Laid-Open Patent No. 2002-161136, there is a proposal for a polyimide which is produced by imidation of a polyimide precursor (polyamidic acid) formed from an aromatic acid dianhydride such as pyromellitic acid dianhydride or 3,3',4,4'-biphenyltetracarboxylic acid dianhydride and trans-1,4-diaminocyclohexane. Although said polyimide shows high-heat resistance and high transparency, rigidity and linearity of the polyimide main chain skeleton are high and, therefore, there is a problem that elongation is low and flexibility is lacking.

In Japanese Laid-Open Patent No. 010993/95, there is a proposal for a colorless and transparent copolymerized polyimide which is formed from an alicyclic diamine having high flexibility such as 4,4'-methylenebis(cyclohexylamine) and a specific aromatic acid dianhydride such as 3,3',4,4'-benzophenonetetracarboxylic acid dianhydride or 3,3',4,4'-diphenylsulfonetetracarboxylic acid dianhydride.

However, glass transition temperature of any of the resulting polyimides is lower than 270° C. and the product can hardly be said to well satisfy the heat resistance. In addition, there is a problem that, in using it as a flexible printed circuit board, its thermal expansion coefficient is high. Furthermore, the proposed polyimide has a poor solubility and it is necessary to be subjected to a heating treatment at high temperature after a molding process (after applying) in a form of a polyamic acid which is a precursor and, therefore, in a continuous production of a flexible metal-clad laminate using said resin, there is a problem that the productivity becomes low, an expensive equipment is necessary and the manufacturing cost becomes high.

DISCLOSURE OF THE INVENTION

Problem that the Invention is to Solve

The present invention is achieved under the above-mentioned problems in prior art as background. Thus, an object of the present invention is to manufacture a flexible metal-clad laminate having excellent heat resistance, flexibility and low thermal expansion together with sufficient colorless transparency and a flexible printed circuit board using the same at low cost.

Means for Solving the Problem

As a result of extensive studies, the present inventors have found that the above problems can be solved by way of the following means and at last achieved the present invention.

Thus, the present invention comprises the following constitutions.

(1) A polyamideimide resin which is characterized in having an alicyclic structure containing the structure represented by the following formula (1), and having an inherent viscosity of 0.8 dl/g or more and 2.5 dl/g or less:

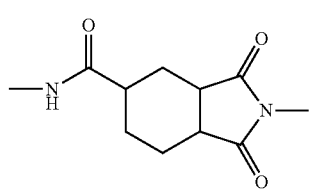

(2) The polyamideimide resin according to the above (1), wherein the resin has an alicyclic structure containing the structure represented by the following formula (2), and has an inherent viscosity of 0.8 dl/g or more and 2.5 dl/g or less:

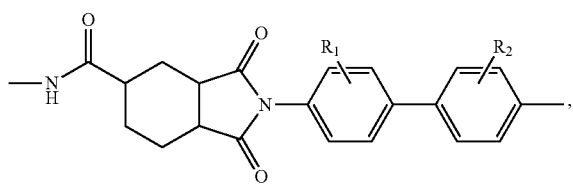
(2)

wherein $R_1$ and $R_2$ each is hydrogen, an alkyl group having 1 to 3 carbon(s) or an allyl group where nitrogen, oxygen, sulfur or halogen may be contained therein.

(3) The polyamideimide resin according to the above (1), wherein the resin has an alicyclic structure containing the structure represented by the following formulae (3) and (4), wherein the ratio of (unit represented by the formula (3))/(unit represented by the formula (4)) is within a range of 99.9/0.1 to 50/50, and wherein the resin has an inherent viscosity of 0.8 dl/g or more and 2.5 dl/g or less:

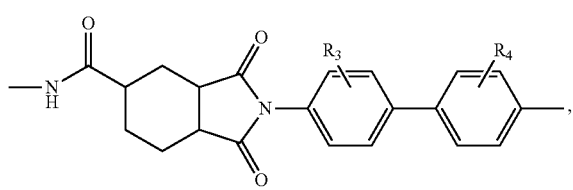
(3)

wherein $R_3$ and $R_4$ each is hydrogen, an alkyl group having 1 to 3 carbon(s) or an allyl group where nitrogen, oxygen, sulfur or halogen may be contained therein;

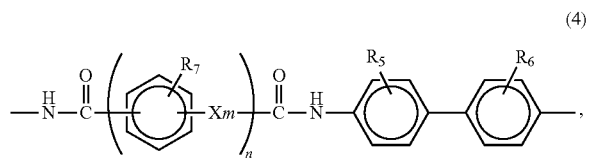
(4)

wherein $R_5$ and $R_6$ each is hydrogen, an alkyl group having 1 to 3 carbon(s) or an allyl group where nitrogen, oxygen, sulfur or halogen may be contained therein; $R_7$ is an alkyl group having 1 to 3 carbon(s) or an allyl group where nitrogen, oxygen, sulfur or halogen may be contained therein; X is an ether group, a sulfone group, or an alkyl group having 1 to 3 carbon(s) or an allyl group; m is an integer of 0 to 2; and n is an integer of 1 to 3.

(4) The polyamideimide resin according to the above (1), wherein the resin has an alicyclic structure containing the structure represented by the following formulae (5) and (6), wherein the ratio of (unit represented by the formula (5))/(unit represented by the formula (6)) is within a range of 99.9/0.1 to 50/50, and wherein the resin has an inherent viscosity of 0.8 dl/g or more and 2.5 dl/g or less:

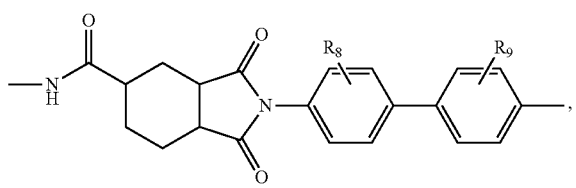
(5)

wherein $R_8$ and $R_9$ each is hydrogen, an alkyl group having 1 to 3 carbon(s) or an allyl group where nitrogen, oxygen, sulfur or halogen may be contained therein;

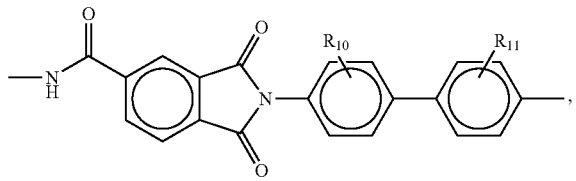
(6)

wherein $R_{10}$ and $R_{11}$ each is hydrogen, an alkyl group having 1 to 3 carbon(s) or an allyl group where nitrogen, oxygen, sulfur or halogen may be contained therein.

(5) The polyamideimide resin according to any one of the above (1) to (4), wherein the glass transition temperature of the polyamideimide resin is not lower than 250° C. and, when said polyamideimide resin is made into a film whose thickness upon drying is 12.5 μm, a light transmittance of the film at the wavelength of 500 nm is not less than 80% and a linear expansion coefficient thereof is not more than 40 ppm/K.

(6) A colorless and transparent polyamideimide film prepared by using the polyamideimide resin according to any one of the above (1) to (5).

(7) A colorless and transparent flexible metal-clad laminate, wherein metal foil is directly laminated or is laminated via an adhesive layer on at least one side of the polyamideimide resin layer according to any one of the above (1) to (6).

(8) A colorless and transparent flexible printed circuit board prepared by using the flexible metal-clad laminate according to the above (7).

(9) The colorless and transparent flexible printed circuit board according to the above (8) prepared by using the polyamideimide resin containing an alicyclic group according to any one of the above (1) to (5) as a cover-lay material.

(10) The colorless and transparent flexible printed circuit board according to the above (8) prepared by using the colorless and transparent polyamideimide film according to the above (6) as a cover-lay film.

(11) The colorless and transparent flexible printed circuit board according to any one of the above (8) to (10), wherein the light transmittance of the non-circuit area after the cover-lay material laminating process at the wavelength of 500 nm is not less than 50%.

Advantages of the Invention

The flexible metal-clad laminate in accordance with the present invention and a flexible printed circuit board prepared by using the same can have excellent heat resistance, flexibility and low thermal expansion together with a sufficient colorless and transparent property. As a result thereof, they can be used in a broad area such as electronic instruments. They are particularly advantageous as a transparent film substrate used, for example, in liquid display and greatly contribute in industry.

BEST MODE FOR CARRYING OUT THE INVENTION

The present invention will be illustrated in detail as hereunder. It is necessary that cyclohexane tricarboxylic acid anhydride is a main monomer as an acid component in the polyamideimide resin which is used for the manufacture of the flexible metal-clad laminate and the flexible printed circuit board of the present invention. When acid components where other aromatic acid dianhydride is a main monomer are used, it is difficult to prepare a flexible metal-clad laminate and a flexible printed board having aimed heat resistance, flexibility and low thermal expansion together with a sufficient colorless and transparent property.

One of the preferred embodiments is a polyamideimide resin constituted from a repeating unit of the following formula (1). Said polyamideimide resin can be produced by a condensation reaction of cyclohexane tricarboxylic acid anhydride or a chloride thereof as an acid component with an amine component such as diamine or diisocyanate.

The cyclohexane tricarboxylic acid anhydride used here may contain an aliphatic hydrocarbon substituent such as methyl group or ethyl group or a halogen substituent such as chlorine or fluorine.

In the present invention, colorless and transparent property can be achieved by using cyclohexane tricarboxylic acid anhydride of an alicyclic type as an acid component for the polyamideimide resin, whereby free selection of amine component becomes possible. As a result, there is available a big advantage that the choices for molecular design in preparing a desired resin characteristic become broader than in the case where transparency of the resin is achieved using an alicyclic amine component. For example, when o-tolidine isocyanate or naphthalene diisocyanate is selected as an amine component, it is possible to prepare a polyamideimide resin which is colorless and transparent and also has excellent heat resistance and low thermal expansion. Another advantage is that degree of polymerization of the polyamideimide increases when alicyclic cyclohexane tricarboxylic acid is used as an acid component as in the present invention as compared with the case where alicyclic one and aromatic one are selected as an amine component and an acid component, respectively for achieving the transparency of the resin.

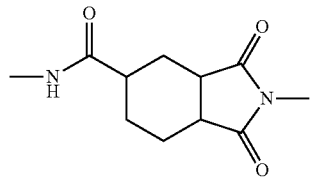

(1)

As to the amine component used in the present invention, examples as a diamine compound include an aromatic diamine such as 2,2'-bis(trifluoromethyl)benzidine, p-phenylenediamine, m-phenylenediamine, 2,4-diaminotoluene, 2,5-diaminotoluene, 2,4-diaminoxylene, 2,4-diaminodurene, 4,4'-diaminodiphenylmethane, 4,4'-methylenebis(2-methylaniline), 4,4'-methylenebis(2-ethylaniline), 4,4'-methylenebis(2,6-dimethylaniline), 4,4'-methylenebis(2,6-diethylaniline), 3,4'-diaminodiphenyl ether, 3,3' diaminodiphenyl ether, 2,4'-diaminodiphenyl ether, 4,4'-diaminodiphenyl sulfone, 3,3'-diaminodiphenyl sulfone, 4,4'-diaminobenzophenone, 3,3'-diaminobenzophenone, 4,4'-diaminodiphenyl sulfide, 3,3'-diaminodiphenyl sulfide, 4,4'-diaminodiphenylpropane, 3,3'-diaminodiphenylpropane, 4,4'-diaminobenzanilide, p-xylenediamine, m-xylenedimaine, 1,4-naphthalenediamine, 1,5-naphthalenediamine, 2,6-naphthalenediamine, 2,7-naphthalenediamine, benzidine, 3,3'-dihydroxybenzidine, 3,3'-dimethoxybenzidine, 3,3'-dimethyl-4,4'-diamino biphenyl, 3,3'-diethyl-4,4'-diamino biphenyl, 2,2'-dimethyl-4,4'-diamino biphenyl, 2,2'-diethyl-4,4'-diamino biphenyl, 3,3'-dimethoxy-4,4'-diamino biphenyl, 3,3'-diethoxy-4,4'-diamino biphenyl, m-tolidine, 1,4-bis(4-aminophenoxy)benzene, 1,3-bis(4-aminophenoxy)benzene, 1,3-bis(3-aminophenoxy)benzene, 4,4'-bis(4-aminophenoxy) biphenyl, bis(4-(3-aminophenoxy)phenyl) sulfone, bis(4-(4-aminophenoxy)phenyl) sulfone, 2,2-bis(4-(4-aminophenoxy)phenyl)propane, 2,2-bis(4-(4-aminophenoxy)phenyl)hexafluoropropane, 2,2-bis(4-aminophenyl) hexafluoropropane or p-terphenylenediamine; an aliphatic diamine such as trans-1,4-diaminocyclohexane, cis-1,4-diaminocyclohexane, 1,4-diaminocyclohexane (a trans/cis mixture), 1,3-diaminocyclohexane, 4,4'-methylenebis(cyclohexylamine) (trans, cis and a trans/cis mixture), isophoronediamine, 1,4-cyclohexanebis(methylamine), 2,5-bis(aminomethyl)bicyclo[2.2.1]heptane, 2,6-bis(aminomethyl)bicyclo[2.2.1]heptane, 3,8-bis(aminomethyl)tricyclo[5.2.1.0]decane, 1,3-diaminoadamantane, 4,4'-methylenebis(2-methylcyclohexylamine), 4,4'-methylenebis(2-ethylcyclohexylamine), 4,4'-methylenebis(2,6-dimethylcyclohexylamine), 4,4'-methylenebis(2,6-diethylcyclohexylamine), 2,2-bis(4-aminocyclohexyl)propane, 2,2-bis(4-aminocyclohexyl)hexafluoropropane, 1,3-propanediamine, 1,4-tetramethylenediamine, 1,5-pentamethylenediamine, 1,6-hexamethylenediamine, 1,7-heptamethylenediamine, 1,8-octamethylenediamine or 1,9-nonamethylenediamine; etc. It is also possible to use two or more thereof jointly.

Among the above, particularly preferred amine component in view of enhancing the heat resistance and low thermal expansion is an amine component having a naphthalene skeleton such as 1,4-naphthalenediamine, 1,5-naphthalenediamine, 2,6-naphthalenediamine or 2,7-naphthalenediamine. More preferred one is a compound represented by, for example, 3,3'-dimethyl-4,4'-diamino biphenyl, 3,3'-diethyl-4,4'-diamino biphenyl, 2,2'-dimethyl-4,4'-diamino biphenyl, 2,2'-diethyl-4,4'-diamino biphenyl, 3,3'-dimethoxy-4,4'-diamino biphenyl or 3,3'-diethoxy-4,4'-diamino biphenyl, and a polyamideimide resin having a biphenyl skeleton represented by the formula (2):

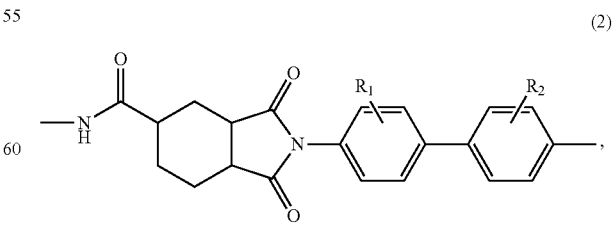

(2)

wherein $R_1$ and $R_2$ each is hydrogen, an alkyl group having 1 to 3 carbon(s) or an allyl group where nitrogen, oxygen, sulfur or halogen may be contained therein.

More preferred embodiment is a copolymerized polyamideimide which contains the constituting units represented by the following formulae (3) and (4) where the molar ratio of the constituting units of the formulae (3) and (4) in terms of [the formula (3)]/[the formula (4)] is from 99.9/0.1 to 50/50, more preferably, [the formula (3)]/[the formula (4)] is from 70/30 to 97/3, and further preferably, [the formula (3)]/[the formula (4)] is from 80/20 to 95/5:

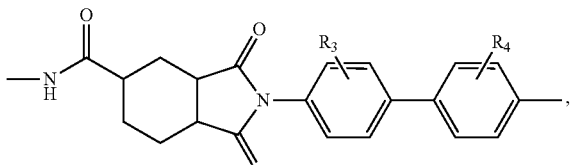

(3)

wherein $R_3$ and $R_4$ each is hydrogen, an alkyl group having 1 to 3 carbon(s) or an allyl group where nitrogen, oxygen, sulfur or halogen may be contained therein;

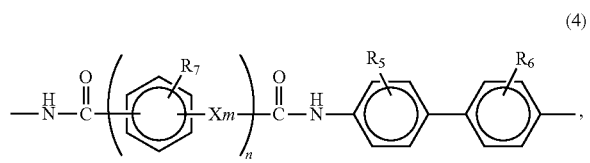

(4)

wherein $R_5$ and $R_6$ each is hydrogen, an alkyl group having 1 to 3 carbon(s) or an allyl group where nitrogen, oxygen, sulfur or halogen may be contained therein; $R_7$ is an alkyl group having 1 to 3 carbon(s) or an allyl group where nitrogen, oxygen, sulfur or halogen may be contained therein; X is an ether group, a sulfone group, or an alkyl group having 1 to 3 carbon(s) or an allyl group; m is an integer of 0 to 2; and n is an integer of 1 to 3.

When the unit of the formula (3) is copolymerized with the unit of the formula (4), a polyamideimide resin having more excellent heat resistance, flexibility and low thermal expansion can be produced. However, when the unit represented by the formula (4) exceeds 50 molar %, transparency lowers, solubility in solvents becomes poor and a process during a stage of a precursor is necessary whereby it becomes difficult to prepare a less expensive flexible metal-clad laminate which is an object of the present invention.

The unit of the formula (4) can be produced by copolymerization of a dicarboxylic acid component such as isophthalic acid, terephthalic acid, biphenyldicarboxylic acid, diphenyl ether dicarboxylic acid or diphenylsulfone dicarboxylic acid as an acid component. Preferred ones are terephthalic acid and biphenyldicarboxylic acid.

Another more preferred embodiment is a copolymerized polyamideimide which contains the constituting units represented by the formulae (5) and (6) where the molar ratio of the constituting units of the formulae (5) and (6) in terms of [the formula (5)]/[the formula (6)] is from 99.9/0.1 to 50/50, preferably, [the formula (5)]/[the formula (6)] is from 60/40 to 97/3, and more preferably, [the formula (5)]/[the formula (6)] is from 70/30 to 95/5:

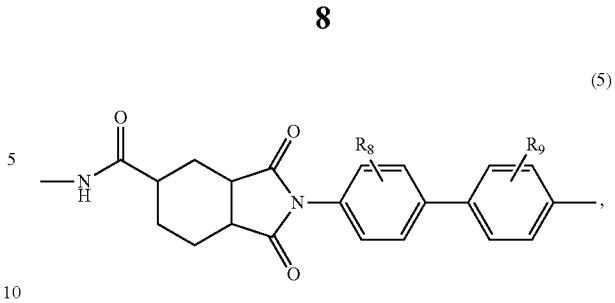

(5)

wherein $R_8$ and $R_9$ each is hydrogen, an alkyl group having 1 to 3 carbon(s) or an allyl group where nitrogen, oxygen, sulfur or halogen may be contained therein;

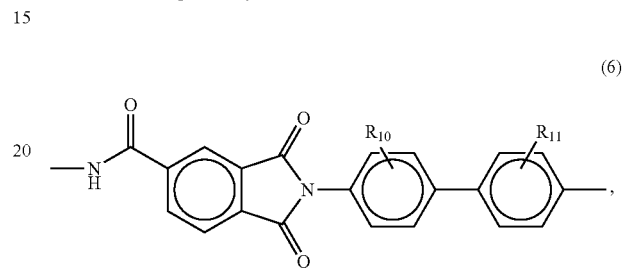

(6)

wherein $R_{10}$ and $R_{11}$ each is hydrogen, an alkyl group having 1 to 3 carbon(s) or an allyl group where nitrogen, oxygen, sulfur or halogen may be contained therein.

When the unit of the formula (5) is copolymerized with the unit of the formula (6), a polyamideimide resin having more excellent heat resistance, flexibility and low thermal expansion can be produced. However, when the unit represented by the formula (6) exceeds 50 molar %, transparency lowers, whereby it becomes difficult to prepare a less colored metal-clad laminate which is an object of the present invention.

The unit of the formula (6) can be produced by copolymerization of a trimellitic acid anhydride component as an acid component.

The polyamideimide resin of the present invention can be synthesized by a conventional method and examples thereof include an isocyanate method, an acid chloride method, a low-temperature solution polymerization method and a room-temperature solution polymerization method. Particularly preferred producing process in view of the manufacturing cost is an isocyanate method where the polymer is prepared by means of a decarboxylation reaction.

Examples of the solvent used for the manufacture of a solution of the polyamideimide resin used in the present invention include, for example, N-methyl-2-pyrrolidone, N,N'-dimethylformamide, N,N'-dimethylacetamide, 1,3-dimethyl-2-imidazolidinone, tetramethylurea, sulfolane, dimethyl sulfoxide, γ-butyrolactone, cyclohexanone and cyclopentanone and a preferred example is N-methyl-2-pyrrolidone. When such a solvent is used as a solvent for polymerization, it can be directly used as a solution for the manufacture of a flexible metal-clad laminate which will be mentioned later.

It is also possible to substitute a part thereof with an organic solvent of a hydrocarbon type such as toluene or xylene; an organic solvent of an ether type such as diglyme, triglyme or tetrahydrofuran; or an organic solvent of a ketone type such as methyl ethyl ketone or methyl isobutyl ketone.

Molecular weight of the polyamideimide resin used in the present invention is preferred to be that which corresponds to 0.8 to 2.5 dl/g, more preferably, which corresponds to 0.9 to 2.3 dl/g, and further preferably, which corresponds to 1.0 to 2.0 dl/g in terms of inherent viscosity at 30° C. in N-methyl-2-pyrrolidone (polymer concentration: 0.5 g/dl). When the inherent viscosity is less than 0.8 dl/g, mechanical characteristic may become insufficient while, when it is more than 2.5 dl/g, viscosity of the solution becomes high whereby molding process into a flexible metal-clad laminate may become difficult and that is not preferred.

Control of the inherent viscosity is carried out by adjusting the molar ratio of the acid component to the amine component. It can be achieved, for example, by appropriately adjusting the molar ratio of the acid component to the amine component while taking the reaction of an isocyanate with a solution into consideration.

Also, if necessary, for a purpose of improving various characteristics of a flexible metal-clad laminate or the flexible printed circuit board such as mechanical characteristic, electric characteristic, slipping property or flame retardancy, the above heat resistant resin solution of the present invention may be mixed with other resin, organic compound or inorganic compound or may be made to react therewith. Thus, for example, lubricant (such as silica, talc or silicone), adhesion promoter, flame retardant (such as that of a phosphorus type or a triazine type or aluminum hydroxide), stabilizer (such as antioxidant, ultraviolet absorber or polymerization inhibitor), metal plating activator, organic or inorganic filler (such as talc, titanium oxide, fine particles of fluorine-type polymer, pigment, dye or calcium carbide) and other organic compound or resin including silicone compound, fluorine compound, isocyanate compound, blocked isocyanate compound, acrylic resin, urethane resin, polyester resin, polyamide resin, epoxy resin or phenol resin or an inorganic compound such as curing agent for the above, silicon oxide, titanium oxide, calcium carbonate or iron oxide may be used together therewith in such an extent that the object of the present invention is not deteriorated.

In the cyclohexanetricarboxylic acid anhydride used in the present invention, there are isomers such as cis, trans, axial and equatorial compounds. Those isomers can be separated and purified by a known method such as distillation or recrystallization and the mixing ratio thereof is not particularly limited.

As to an acid component used in the present invention, cyclohexanetricarboxylic acid dianhydride is essential and, within such an extent that the advantages of the present invention are not deteriorated, it is also possible to use other acid component together therewith. Examples thereof include 3,3',4,4'-biphenyltetracarboxylic acid dianhydride, 2,3,3',4'-biphenyltetracarboxylic acid dianhydride, 3,3',4,4'-benzophenonetetracarboxylic acid dianhydride, 3,3',4,4'-diphenylsulfonetetracarboxylic acid dianhydride, 4,4'-oxydiphthalic acid anhydride, 1,4,5,8-naphthalenetetracarboxylic acid dianhydride, 1,4,5,6-naphthalenetetracarboxylic acid dianhydride, 2,3,6,7-naphthalenetetracarboxylic acid dianhydride, 3,4,9,10-perylenetetracarboxylic acid dianhydride, butane-1,2,3,4-tetracarboxylic acid anhydride, cyclopentane-1,2,3,4-tetracarboxylic acid anhydride, adipic acid, azelaic acid, sebacic acid, cyclohexane-4,4'-dicarboxylic acid and butane-1,2,4-tricarboxylic acid anhydride and they are non-limitative. Each of those acid components may be used solely or two or more thereof may be used jointly.

In the formulae (2), (3), (4), (5) and (6), it is also possible to use other diamine or diisocyanate together therewith in such an extent that the advantages of the present invention are not deteriorated. Examples thereof are an aromatic diamine such as 2,2'-bis(trifluoromethyl)benzidine, p-phenylenediamine, m-phenylenediamine, 2,4-diaminotoluene, 2,5-diaminotoluene, 2,4-diaminoxylene, 2,4-diaminodurene, 4,4'-diaminodiphenylmethane, 4,4'-methylenebis(2-methylaniline), 4,4'-methylenebis(2-ethylaniline), 4,4'-methylenebis(2,6-dimethylaniline), 4,4'-methylenebis(2,6-diethylaniline), 3,4'-diaminodiphenyl ether, 3,3'-diaminodiphenyl ether, 2,4'-diaminodiphenyl ether, 4,4'-diaminodiphenyl sulfone, 3,3'-diaminodiphenyl sulfone, 4,4'-diaminobenzophenone, 3,3'-diaminobenzophenone, 4,4'-diaminodiphenyl sulfide, 3,3'-diaminodiphenyl sulfide, 4,4'-diaminodiphenylpropane, 3,3'-diaminodiphenylpropane, 4,4'-diaminobenzanilide, p-xylenediamine, m-xylenediamaine, 1,4-naphthalenediamine, 1,5-naphthalenediamine, 2,6-naphthalenediamine-2,7-naphthalenediamine, benzidine, 3,3'-dihydroxybenzidine, 3,3'-dimethoxybenzidine, m-tolidine, 1,4-bis(4-aminophenoxy)benzene, 1,3-bis(4-aminophenoxy)benzene, 1,3-bis(3-aminophenoxy)benzene, 4,4'-bis(4-aminophenoxy) biphenyl, bis(4-(3-aminophenoxy)phenyl) sulfone, bis(4-(4-aminophenoxy)phenyl) sulfone, 2,2-bis(4-(4-aminophenoxy)phenyl)propane, 2,2-bis(4-(4-aminophenoxy)phenyl)hexafluoropropane, 2,2-bis(4-aminophenyl)hexafluoropropane or p-terphenylenediamine; diisocyanated compounds of these aromatic diamines; an aliphatic diamine such as trans-1,4-diaminocyclohexane, cis-1,4-diaminocyclohexane, 1,4-diaminocyclohexane (a trans/cis mixture), 1,3-diaminocyclohexane, 4,4'-methylenebis(cyclohexylamine) (trans, cis and a trans/cis mixture), isophoronediamine, 1,4-cyclohexanebis(methylamine), 2,5-bis(aminomethyl)bicyclo[2.2.1]heptane, 2,6-bis(aminomethyl)bicyclo[2.2.1]heptane, 3,8-bis(aminomethyl)tricyclo[5.2.1.0]decane, 1,3-diaminoadamantane, 4,4'-methylenebis(2-methylcyclohexylamine), 4,4'-methylenebis(2-ethylcyclohexylamine), 4,4'-methylenebis(2,6-dimethylcyclohexylamine), 4,4'-methylenebis(2,6-diethylcyclohexylamine), 2,2-bis(4-aminocyclohexyl)propane, 2,2-bis(4-aminocyclohexyl)hexafluoropropane, 1,3-propanediamine, 1,4-tetramethylenediamine, 1,5-pentamethylenediamine, 1,6-hexamethylenediamine, 1,7-heptamethylenediamine, 1,8-octamethylenediamine or 1,9-nonamethylenediamine; and diisocyanated compounds of these aliphatic diamines etc and they are non-limitative. It is also possible to use two or more thereof jointly. Each of those diamines may be used solely or two or more thereof may be used jointly.

The flexible metal-clad laminate of the present invention is manufactured in such a manner that the solution of the polyamideimide prepared in the above polymerization is directly applied on a metal foil followed by drying and curing or that a film is firstly prepared using the above polyamideimide solution and then the film is laminated to a metal foil using an adhesive. As to a method for the manufacture of a flexible metal-clad laminate by means of a direct application of the polyamideimide solution on the metal foil followed by drying and curing, there is no particular limitation but any method which has been known already may be used. For example, the polyamideimide solution applied on the metal foil in a desired thickness is dried at the temperature of 40° C. to 180° C. and then subjected to a thermal treatment at the temperature of 200° C. to 400° C. in air, in an atmosphere of inert gas such as nitrogen or in vacuo to give the flexible metal-clad laminate of the present invention. It is also possible that the non-metal foil sides of the resulting two flexible metal-clad laminates are adhered or the non-metal foil side of the resulting flexible metal-clad laminate is adhered with a copper foil using an adhesive so as to give a flexible double sided metal-clad laminate.

As to a method for the manufacture of a metal-clad laminate by such a manner that a film is firstly prepared using the polyamideimide solution and then laminated with a metal foil using an adhesive, there is no particular limitation but any method which has been known already may be used. For example, the polyamideimide solution is applied on a support such as endless belt, drum or carrier film, the applied coat is dried at the temperature of 40° C. to 180° C., the film is detached from said support if necessary followed by treating at the temperature of 200° C. to 400° C. to manufacture a polyamideimide film and said film is adhered to a metal foil using an adhesive by a means of heating lamination for example whereupon the metal-clad laminate of the present invention is prepared. It is also possible that metal foil is adhered to the non-metal foil side of the resulting flexible metal-clad laminate using an adhesive so as to give a flexible double sided metal-clad laminate.

It goes without saying that the polyamideimide resin used for the manufacture of the flexible metal-clad laminate may be poly(amide/amic acid) which is a precursor and, in that case, its manufacture is possible by changing the conditions such as temperature in each of the above drying and curing steps.

As to a metal foil used in the present invention, it is possible to use, for example, copper foil, aluminum foil, steel foil or nickel foil and it is also possible to use a composite metal foil where the above are compounded or a metal foil treated with other metal such as zinc or chromium compound. Although there is no particular limitation for the thickness of the metal foil, that of 1 to 50 μm, for example, may be advantageously used. For the purpose of suppressing the curl of the flexible printed circuit board, a metal foil where tensile strength is preferably not less than 350 N/mm², more preferably, not less than 550 N/mm² is recommended.

As to an adhesive used for the formation of the flexible metal-clad laminate, there is no particular limitation and there may be used an adhesive of an acrylonitrile butadiene rubber (NBR) type, a polyamide type, a polyester type, a polyester urethane type, an epoxy resin type, an acrylic resin type, a polyimide type, a polyamideimide type or a polyesterimide type and, in view of colorless transparency and flex resistance, that of a polyester or polyester urethane resin type or a resin composition where said resin is compounded with epoxy resin is preferred. Thickness of the adhesive layer is preferred to be about 5 to 30 μm. In view of heat resistance and adhesiveness, that of a polyimide resin type or a polyamideimide resin type or a resin composition where said resin is compounded with epoxy resin is preferred. Thickness of the adhesive layer is preferred to be about 5 to 30 μm. There is no particular limitation for the thickness of the adhesive so far as it does not deteriorate the achievement of the properties of the flexible printed circuit board. However, when the thickness is too thin, a sufficient adhesiveness may not be achieved while, when it is too thick, processing ability (drying property or applying property) may lower.

Thickness of the polyamideimide layer in the flexible metal-clad laminate of the present invention may be selected from a wide range and, in general, it is about 5 to 100 μm, preferably, about 10 to 50 μm in terms of thickness after absolute drying. When the thickness is less than 5 μm, mechanical property such as film strength and handling property of the film are inferior while, when it is more than 100 μm, characteristics such as flexibility and processing ability (drying property or applying property) tend to lower. Glass transition temperature of the polyamideimide layer is preferred to be not lower than 250° C., more preferably, not lower than 280° C., and further preferably, not lower than 300° C. When it is lower than 250° C., there is a risk of generation of inconvenience in terms of heat resistance upon soldering, etc.

If necessary, the flexible metal-clad laminate of the present invention may be subjected to a surface treatment. For example, a surface treatment such as hydrolysis, low-temperature plasma, physical roughening or easily-adhesive coating treatment may be carried out.

When said polyamideimide resin is made into a film where the dry film thickness is 12.5 μm, it is necessary that the light transmittance of the film at the wavelength of 500 nm is not less than 80%. More preferably, the light transmittance is not less than 85%, and most preferably, not less than 90%. When the light transmittance is less than 80%, the transparency upon making into a flexible printed circuit board using the present resin is not sufficient and there is a risk that the characteristic as a transparent substrate to be used in a liquid crystal display, etc. is not well satisfactory. An example of a technique for further enhancing the transparency of said polyamideimide resin is to make the rate of cyclohexanetricarboxylic acid anhydride to the whole acid components much more. In addition, the thermal expansion coefficient of the polyamideimide resin used in the present invention is preferred to be not less than 1 ppm and not more than 40 ppm, more preferably, not less than 5 ppm and not more than 35 ppm, and further preferably, not less than 10 ppm and not more than 30 ppm. When the coefficient is less than 1 ppm or more than 40 ppm, warpage of the laminate or distortion or crack of the laminate due to residue of internal stress may happen because of a big difference between the thermal expansion coefficients when the polyamideimide resin is combined with the metal layer (such as copper having a thermal expansion coefficient of 18 ppm) or a metal oxide layer whereby that is not preferred.

Incidentally, said thermal expansion coefficient can be achieved by appropriately selecting structure and composition of the resin of the present invention, for example, by making the ratio of o-tolidine isocyanate or naphthalene diisocyanate to the whole amine components big.

As a result of the use of the flexible metal-clad laminate of the present invention, it is now possible to prepare a flexible printed circuit board having excellent heat resistance and flexibility together with sufficient colorless transparency. As to a method for manufacturing the same, it is possible to use a conventionally known process. For example, a cover film having an adhesive in which an adhesive layer is laminated on a film such as polyimide is firstly prepared. On the other hand, a desired circuit is subjected to a patterning on the metal foil surface of the flexible metal-clad laminate of the present invention and then subjected to the treatments of etching, washing with water and drying to prepare a flexible metal-clad laminate subjected to a circuit processing. The cover film having an adhesive and the flexible metal-clad laminate subjected to circuit processing as such are adhered whereupon the flexible printed circuit board of the present invention can be prepared. Although there is no particular limitation for the film used in the preparation of the cover film having an adhesive, a film of a polyimide type containing alicyclic group or a film of a polyamideimide type containing alicyclic group is preferably used in view of heat resistance and colorless transparency and, more preferably, a film comprising the polyamideimide resin used for the flexible metal-clad laminate of the present invention having excellent heat resistance, colorless transparency and flexibility is used.

As to a method for covering the circuit surface, a method where a liquid coating agent is applied to a circuit board by means of a screen printing method can be adopted also. As to the liquid coating agent, conventionally known ink of an epoxy type or a polyimide type may be used and that of a polyimide type is particularly preferred in view of heat resistance. Although there is no particular limitation, a polyimide resin containing alicyclic group or a polyamideimide resin containing alicyclic group is preferably used in view of heat resistance and colorless transparency and, more preferably, the polyamideimide resin used for the flexible metal-clad laminate of the present invention having excellent heat resistance, colorless transparency and flexibility is used.

In the flexible printed circuit board of the present invention, the light transmittance at the wavelength of 500 nm at the non-circuit area after adhesion of cover-lay film or application of the liquid coating agent followed by curing and drying is not less than 50%, more preferably, not less than 60%, further preferably, not less than 70%, and most preferably, 100%. When the light transmittance is less than 50%, transparency is not sufficient and there is a risk that the characteristic as a transparent film substrate used for a liquid display, etc. is not well satisfied. The high light transmittance as such can be achieved by the use of much more amount of cyclohexanetricarboxylic acid anhydride as an acid component of the polyamideimide resin.

As to the cover-lay film, it is preferred to use the resin of the present invention or the film of the present invention.

EXAMPLES

The present invention will now be further specifically illustrated by using the following Examples although the present invention is not limited thereto. The measured values mentioned in the Examples are measured as follows. In the Examples, the term described as simply "parts" refers to the parts by mass.

Inherent viscosity: The polymer was dissolved in N-methyl-2-pyrrolidone so as to make the polymer concentration 0.5 g/dl and the solution viscosity and solvent viscosity of the resulting solution were measured at 30° C. using a viscosity tube of a Ubbelohde type and calculated by the following formula.

Inherent viscosity(g/dl)=[ln($V1/V2$)]/$V3$

In the above formula, V1 is a solution viscosity measured by a Ubbelohde viscosity tube, V2 is a solvent viscosity measured by a Ubbelohde viscosity tube, and V1 and V2 are determined from the time when the polymer solution and the solvent (N-methyl-2-pyrrolidone) passed through the capillary of the viscosity tube. V3 is the polymer concentration (g/dl).

Tg: Glass transition temperature of the resin film layer wherefrom metal foil of the flexible metal-clad laminate of the present invention was subjected to an etching removal by a TMA (thermomechanical analysis; manufactured by Rigaku K. K.) tensile load method was measured under the following condition. Thus, the measurement was conducted for the film where it was once heated to an inflection point at a raising rate of 10° C./minute in nitrogen and then cooled down to room temperature.

Load: 5 g
Sample size: 4(width)×20(length) mm
Raising rate: 10° C./minute
Atmosphere: nitrogen Thermal expansion coefficient: Thermal expansion coefficient of the resin film layer wherefrom metal foil of the flexible metal-clad laminate of the present invention was subjected to an etching removal by a TMA (thermomechanical analysis; manufactured by Rigaku K. K.) tensile load method was measured under the following condition. Thus, the measurement was conducted for the film where it was once heated to an inflection point at a raising rate of 10° C./minute in nitrogen and then cooled down to room temperature.

Load: 1 g
Sample size: 4(width)×20(length) mm
Raising rate: 10° C./minute
Atmosphere: nitrogen
Measured temperature range: 100° C. to 200° C.

Heat resistance upon soldering: Metal foil of the flexible metal-clad laminate was subjected to an etching processing by a subtractive method (35% ferric chloride solution) to prepare a circuit pattern where the width was 1 mm. This sample was moistened at 25° C. and 65% (humidity) for 24 hours, subjected to a flux washing and dipped into a jet solder bath of 300° C. for 20 seconds and the appearance was observed for abnormality, if any, such as peeling or swelling.

(Judgment) o: no abnormality was noted in the appearance
Δ: few abnormality was noted in the appearance
x: abnormality was noted in the appearance Bonding strength: In accordance with IPC-FC 241 (IPC-TM-650, 2.4.9(A)), a sample where a circuit pattern was formed by a subtractive method was used and the bonding strength between the circuit pattern and the polyimide resin layer was measured.

Tensile strength, elongation at break and tensile modulus of film: A sample of 10 mm width and 100 mm length was prepared from the resin film resulted by subjecting the metal foil to an etching removal and then the measurement was conducted by a tensile tester ("Tensilon Tensile Tester" (trade name); manufactured by Toyo Baldwin) where tensile speed was 20 mm/minute and distance between the chucks was 40 mm.

Light transmittance: Light transmittance was measured by a spectrophotometer ("UV-3150" (trade name); manufactured by Shimadzu Corporation).

Dimensional changing rate: Values before and after the circuit processing were measured (method B) according to IPC-TM-650, 2.2.2(b) while values before and after the thermal treatment were measured (method C: under the condition of 150° C. for 30 minutes) according to IPC-TM-50, 2.2.4(c) in each MD direction.

Example 1

Into a reactor were placed 19.8 g (0.1 mol) of cyclohexanetricarboxylic acid anhydride, 26.4 g of o-tolidine diisocyanate and 0.11 g of potassium fluoride and the mixture was dissolved in 150 g of N-methyl-2-pyrrolidone and made to react at 80° C. to 150° C. for 8 hours in a nitrogen stream with stirring to give a transparent and viscous polyamideimide solution. Inherent viscosity of the resulting polyamideimide was 1.1 dl/g.

The polyamideimide solution prepared as such was coated on an electrolyzed copper foil of 18 μm thickness (trade name: "FWL"; manufactured by Furukawa Circuit Foil K. K.) using a knife coater so as to make the thickness after removal of the solvent 12.5 μm. After that, it was dried at 100° C. for 5 minutes to give a primarily dried flexible metal-clad laminate. Then the laminate subjected to a primary drying was wound on an aluminum tube having an outer diameter of 6 inches so as to make the coated surface outside, subjected to a stepwise thermal treatment in an inert oven in a nitrogen stream (flow rate: 20 liters/minute) at 200° C. for 1 hour, at 250° C. for 1 hour and at 300° C. for 30 minutes and various characteristics of the resulting laminate as shown in Tables 1 and 2 were evaluated. Further, the polyamideimide solution was coated on a releasing polyester film of 100 μm thickness so as to make the thickness after drying 12.5 μm, dried at 10° C. for 5 minutes and released from the releasing polyester film. The released film was fixed with an iron frame and subjected to a stepwise thermal treatment in an inert oven in a nitrogen stream (flow rate: 20 liters/minute) at 200° C. for 1 hour, at 250° C. for 1 hour and at 300° C. for 30 minutes and various characteristics of the resulting polyamideimide film as shown in Tables 1 and 2 were evaluated. The results are shown in Tables 1 and 2.

Example 2

Into a reactor were placed 17.8 g (0.09 mol) of cyclohexanetricarboxylic acid anhydride, 1.7 g (0.01 mol) of terephthalic acid, 26.4 g (0.1 mol) of o-tolidine diisocyanate and 0.15 g of triethylene diamine and the mixture was dissolved in 150 g of N-methyl-2-pyrrolidone and made to react at 80° C. to 150° C. for 8 hours in a nitrogen stream with stirring to give a transparent and viscous polyamideimide solution. Inherent viscosity of the resulting polyamideimide was 1.0 dl/g.

The polyamideimide solution prepared as such was coated on an electrolyzed copper foil of 18 μm thickness (trade name: "FWL"; manufactured by Furukawa Circuit Foil K. K.) using a knife coater so as to make the thickness after removal of the solvent 12.5 μm. After that, it was dried at 10° C. for 5 minutes to give a primarily dried flexible metal-clad laminate. Then the laminate subjected to a primary drying was wound on an aluminum tube having an outer diameter of 6 inches so as to make the coated surface outside, subjected to a stepwise thermal treatment in an inert oven in a nitrogen stream (flow rate: 20 liters/minute) at 200° C. for 1 hour, at 250° C. for 1 hour and at 300° C. for 30 minutes and various characteristics of the resulting as shown in Tables 1 and 2 were evaluated. Further, the polyamideimide solution was coated on a releasing polyester film of 100 μm thickness so as to make the thickness after drying 12.5 μm, dried at 100° C. for 5 minutes and released from the releasing polyester film. The released film was fixed with an iron frame and subjected to a stepwise thermal treatment in an inert oven in a nitrogen stream (flow rate: 20 liters/minute) at 200° C. for 1 hour, at 250° C. for 1 hour and at 300° C. for 30 minutes and various characteristics of the resulting polyamideimide film as shown in Tables 1 and 2 were evaluated. The results are shown in Tables 1 and 2.

Examples 3 to 5

Polyamideimide solutions, flexible metal-clad laminates and films mentioned in Tables 1 and 2 were prepared by the same manner as in Examples 1 and 2 and various characteristics thereof were evaluated. The results are shown in Tables 1 and 2.

Comparative Example 1

The same operation as in Example 2 was carried out except that the amounts of cyclohexanetricarboxylic acid anhydride and terephthalic acid were made 7.9 g (0.04 mol) and 10.0 g (0.06 mol), respectively whereupon a polyamideimide solution was prepared. However, resin was separated upon polymerization and the mixture became insoluble.

Example 6

Into a reactor were placed 17.8 g (0.09 mol) of cyclohexanetricarboxylic acid anhydride, 1.9 g (0.01 mol) of trimellitic acid anhydride, 26.4 g (0.1 mol) of o-tolidine diisocyanate and 0.15 g of triethylene diamine and the mixture was dissolved in 150 g of N-methyl-2-pyrrolidone and made to react at 80° C. to 150° C. for 8 hours in a nitrogen stream with stirring to give a transparent and viscous polyamideimide solution. Inherent viscosity of the resulting polyamideimide was 1.1 dl/g.

The polyamideimide solution prepared as such was coated on an electrolyzed copper foil of 18 μm thickness (trade name: "FWL"; manufactured by Furukawa Circuit Foil K. K.) using a knife coater so as to make the thickness after removal of the solvent 12.5 μm. After that, it was dried at 10° C. for 5 minutes to give a primarily dried flexible metal-clad laminate. Then the laminate subjected to a primary drying was wound on an aluminum tube having an outer diameter of 6 inches so as to make the coated surface outside, subjected to a stepwise thermal treatment in an inert oven in a nitrogen stream (flow rate: 20 liters/minute) at 200° C. for 1 hour, at 250° C. for 1 hour and at 300° C. for 30 minutes and various characteristics of the resulting laminate as shown in Tables 1 and 2 were evaluated. Further, the polyamideimide solution was coated on a releasing polyester film of 100 μm thickness so as to make the thickness after drying 12.5 μm, dried at 100° C. for 5 minutes and released from the releasing polyester film. The released film was fixed with an iron frame and subjected to a stepwise thermal treatment in an inert oven in a nitrogen stream (flow rate: 20 liters/minute) at 200° C. for 1 hour, at 250° C. for 1 hour and at 300° C. for 30 minutes and various characteristics of the resulting polyamideimide film as shown in Tables 1 and 2 were evaluated. The results are shown in Tables 1 and 2.

Example 7

Into a reactor were placed 17.8 g (0.09 mol) of cyclohexanetricarboxylic acid anhydride, 2.4 g (0.01 mol) of 4,4'-biphenyldicarboxylic acid, 26.4 g (0.1 mol) of o-tolidine diisocyanate and 0.15 g of triethylene diamine and the mixture was dissolved in 150 g of N-methyl-2-pyrrolidone and made to react at 80° C. to 150° C. for 8 hours in a nitrogen stream with stirring to give a transparent and viscous polyamideimide solution. Inherent viscosity of the resulting polyamideimide was 1.1 dl/g.

The polyamideimide solution prepared as such was coated on an electrolyzed copper foil of 18 μm thickness (trade name: "FWL"; manufactured by Furukawa Circuit Foil K. K.) using a knife coater so as to make the thickness after removal of the solvent 12.5 μm. After that, it was dried at 100° C. for 5 minutes to give a primarily dried flexible metal-clad laminate. Then the laminate subjected to a primary drying was wound on an aluminum tube having an outer diameter of 6 inches so as to make the coated surface outside, subjected to a stepwise thermal treatment in an inert oven in a nitrogen stream (flow rate: 20 liters/minute) at 200° C. for 1 hour, at 250° C. for 1 hour and at 300° C. for 30 minutes and various characteristics of the resulting laminate as shown in Tables 1 and 2 were evaluated. Further, the polyamideimide solution was coated on a releasing polyester film of 100 μm thickness so as to make the thickness after drying 12.5 μm, dried at 100° C. for 5 minutes and released from the releasing polyester film. The released film was fixed with an iron frame and subjected to a stepwise thermal treatment in an inert oven in a nitrogen stream (flow rate: 20 liters/minute) at 200° C. for 1 hour, at 250° C. for 1 hour and at 300° C. for 30 minutes and various characteristics of the resulting polyamideimide film as shown in Tables 1 and 2 were evaluated. The results are shown in Tables 1 and 2.

Comparative Example 2

The same operation as in Example 6 was carried out except that the amounts of trimellitic acid anhydride, o-tolidine diisocyanate and toluene diisocyanate were made 19.0 g (0.10 mol), 21.1 g (0.08 mol) and 3.5 g (0.02 mol), respectively whereupon a polyamideimide resin was prepared. Inherent viscosity of the resulting polyamideimide was 1.5 dl/g. After that, the same operation as in Example 6 was carried out to prepare a flexible metal-clad laminate and a film and then various characteristics as shown in Tables 1 and 2 were valuated whereupon a significant lowering in the light transmittance was noted. The results are shown in Tables 1 and 2.

Comparative Example 3

The same operation as in Example 6 was carried out except that the amount of o-tolidine diisocyanate was made 25.1 g (0.095 mol), whereupon a polyamideimide resin was prepared. Inherent viscosity of the resulting polyamideimide was 0.4 dl/g. After that, the same operation as in Example 6 was carried out to prepare a flexible metal-clad laminate and a film and then various characteristics as shown in Tables 1 and 2 were valuated. The results are shown in Tables 1 and 2.

TABLE 1

Inherent viscosity and physical characteristics of the film

| | Composition | Inherent viscosity | Tg (° C.) | CTE (ppm/K) | Tensile strength (MPa) | Elongation at break (%) | Tensile modulus (Gpa) | Light transmittance (%) | Remarks |
|---|---|---|---|---|---|---|---|---|---|
| Example 1 | CHT/TODI 100/100 mol | 1.1 | 300 | 33 | 140 | 30 | 3.9 | 89 | |
| Example 2 | CHT/TPA/TODI 90/10/100 mol | 1.0 | 305 | 30 | 140 | 24 | 4.0 | 87 | |
| Example 3 | CHT/TPA/TODI 90/10/99 mol | 0.8 | 303 | 31 | 120 | 20 | 4.0 | 87 | |
| Example 4 | CHT/TPA/TODI 90/10/101 mol | 2.3 | 306 | 30 | 165 | 40 | 4.1 | 88 | |
| Example 5 | CHT/TPA/TODI 90/10/100 mol | 1.0 | 306 | 29 | 142 | 23 | 4.1 | 86 | lubricant is added |
| Comparative Example 1 | CHT/TPA/TODI 40/60/100 mol | insoluble | — | — | — | — | — | — | |
| Example 6 | CHT/TMA/TODI 90/10/100 mol | 1.1 | 305 | 31 | 135 | 26 | 4.0 | 86 | |
| Example 7 | CHT/BB/TODI 90/10/100 mol | 1.1 | 310 | 29 | 145 | 20 | 4.2 | 85 | |
| Example 10 | CHT/TMA/TODI 40/60/100 mol | 1.2 | 310 | 29 | 155 | 23 | 4.3 | 45 | |
| Example 11 | CHT/TMA/TODI 60/40/100 mol | 0.9 | 300 | 33 | 160 | 19 | 4.0 | 55 | |
| Comparative Example 2 | TMA/TODI/TDI 100/80/20 mol | 1.5 | 300 | 30 | 170 | 40 | 6.0 | 35 | |
| Comparative Example 3 | CHT/TMA/TODI 90/10/95 mol | 0.4 | 240 | 35 | 45 | 3 | 4.0 | 86 | |
| Comparative Example 4 | CHT/TPA/TODI 90/10/95 mol | 0.5 | 300 | 32 | 50 | 5 | 3.9 | 86 | |
| Comparative Example 5 | CHT/TPA/TODI 90/10/102 mol | gelation | — | — | — | — | — | — | |

TABLE 2

Characteristics of the flexible metal-clad laminate (a copper foil is laminated on one side)

| | Composition | Heat resistance upon soldering | Bonding strength (N/cm) | Dimensional changing rate Method B | Dimensional changing rate Method C | Remarks |
|---|---|---|---|---|---|---|
| Example 1 | CHT/TODI 100/100 mol | ○ | 10.6 | −0.08 | −0.05 | |
| Example 2 | CHT/TPA/TODI 90/10/100 mol | ○ | 9.8 | −0.06 | −0.04 | |
| Example 3 | CHT/TPA/TODI 90/10/99 mol | ○ | 8.8 | −0.05 | −0.03 | |
| Example 4 | CHT/TPA/TODI 90/10/101 mol | ○ | 10.0 | −0.07 | −0.05 | |
| Example 5 | CHT/TPA/TODI 90/10/100 mol | ○ | 9.7 | −0.06 | −0.04 | lubricant is added |
| Comparative Example 1 | CHT/TPA/TODI 40/60/100 mol | — | — | — | — | |
| Example 6 | CHT/TMA/TODI 90/10/100 mol | ○ | 10.1 | −0.05 | −0.05 | |
| Example 7 | CHT/BB/TODI 90/10/100 mol | ○ | 9.6 | −0.04 | −0.04 | |

TABLE 2-continued

Characteristics of the flexible metal-clad laminate
(a copper foil is laminated on one side)

| | Composition | Heat resistance upon soldering | Bonding strength (N/cm) | Dimensional changing rate Method B | Dimensional changing rate Method C | Remarks |
|---|---|---|---|---|---|---|
| Example 10 | CHT/TMA/TODI 40/60/100 mol | ○ | 10.3 | −0.04 | −0.04 | |
| Example 11 | CHT/TMA/TODI 60/40/100 mol | ○ | 9.5 | −0.06 | −0.08 | |
| Comparative Example 2 | TMA/TODI/TDI 100/80/20 mol | ○ | 10.0 | −0.03 | −0.03 | |
| Comparative Example 3 | CHT/TMA/TODI 90/10/95 mol | x | — (breaking of the substrate) | — (breaking of the substrate) | — (breaking of the substrate) | |
| Comparative Example 4 | CHT/TPA/TODI 90/10/95 mol | x | — (breaking of the substrate) | — (breaking of the substrate) | — (breaking of the substrate) | |
| Comparative Example 5 | CHT/TPA/TODI 90/10/102 mol | — | — | — | — | |

Comparative Examples 4 and 5

Polyamideimide solutions, flexible metal-clad laminates and films mentioned in Tables 1 and 2 were prepared by the same manner as in Example 2 and various characteristics thereof were evaluated. The results are shown in Tables 1 and 2.

Example 8

The flexible metal-clad laminate prepared in Example 2 was applied with KW (polyester urethane/epoxy type; an adhesive manufactured by Toyobo Co., Ltd.) using a comma coater so as to make the thickness after drying 15 μm and then dried at 80° C. for 3 minutes and at 150° C. for 3 minutes to give a copper-clad laminate having an adhesive. After that, a mat side (treated side) of electrolyzed copper foil (FWL; manufactured by Furukawa Circuit Foil K. K.) and the adhesive side of the above copper-clad laminate having an adhesive were laminated each other and subjected to a roll lamination under the condition where temperature was 160° C., pressure was 20 Kgf/cm² and passing speed was 3 m/minute. Then an after-curing was conducted under the condition of 100° C. for 16 hours to give a flexible double sided metal-clad laminate having a good appearance without curl. Then various characteristics as shown in Table 3 were valuated. The results are shown in Table 3.

Example 9

The flexible metal-clad laminate prepared in Example 2 was applied with an adhesive manufactured by Toyobo Co., Ltd. (polyester; GK390 (manufactured by Toyobo Co., Ltd.)/epoxy resin; BLEN S (manufactured by Nippon Kayaku Co., Ltd.)/curing agent; benzophenonetetracarboxylic acid dianhydride (manufactured by Daicel Chemical Industries, Ltd.)=100 parts/45 parts/8 parts, concentration: 40 weight %, solvent: methyl ethyl ketone/toluene) using a comma coater so as to make the thickness after drying 15 μm and then dried at 80° C. for 3 minutes and at 150° C. for 3 minutes to give a copper-clad laminate having an adhesive. After that, a mat side (treated side) of electrolyzed copper foil (FWL; manufactured by Furukawa Circuit Foil K. K.) and the adhesive side of the above copper-clad laminate having an adhesive were laminated each other and subjected to a roll lamination under the condition where temperature was 160° C., pressure was 20 Kgf/cm² and passing speed was 1 m/minute. Then an after-curing was conducted under the condition of 150° C. for 8 hours to give a flexible double sided metal-clad laminate having a good appearance without curl. Then various characteristics as shown in Table 3 were valuated. The results are shown in Table 3.

TABLE 3

Characteristics of the flexible metal-clad laminate
(copper foils are laminated on double sides)

| | Adhesive composition | Transmittance of the substrate (500 nm, %) | Heat resistance upon soldering | Bonding strength (N/cm) | Dimensional changing rate Method B | Dimensional changing rate Method C |
|---|---|---|---|---|---|---|
| Example 8 | KW manufactured by Toyobo Co., Ltd. | 73 | ○ | 9.8 | −0.07 | −0.04 |
| Example 9 | GK manufactured by Toyobo Co., Ltd. | 75 | ○ | 9.7 | −0.06 | −0.04 |

Example 10

The same operation as in Example 6 was carried out except that the amounts of cyclohexane tricarboxylic acid anhydride and trimellitic acid anhydride were made 7.9 g (0.04 mol) and 11.5 g (0.06 mol), respectively whereupon a polyamideimide resin was prepared. Inherent viscosity of the resulting polyamideimide was 1.2 dl/g. After that, the same operation as in Example 6 was carried out to prepare a flexible metal-clad laminate and a film and then various characteristics as shown in Tables 1 and 2 were valuated. The results are shown in Tables 1 and 2.

Example 11

Polyamideimide solutions, flexible metal-clad laminates and films mentioned in Tables 1 and 2 were prepared by the same manner as in Example 10 and various characteristics thereof were evaluated. The results are shown in Tables 1 and 2.

Example 12

The photosensitive resist was laminated on the copper foil surface of the flexible metal-clad laminate prepared in Example 9 and then subjected to exposure to light using a mask film followed by printing and developing to transfer the necessary pattern (a pattern for the evaluation described in IPC-FC241, JIS Z 3197, or JIS C 5016). After that, the copper foil was subjected to an etching removal using a 35% cupric chloride solution of 40° C., the resist used for the circuit formation was removed using an alkali and a circuit processing was conducted on double sides of the substrate.

After that, an ink (compounded with 100 parts of alicyclic polyamideimide resin, 2 parts of acrylic resin (AC-326F manufactured by Kyoeisha K. K.) and 10 parts of silica) where a coating agent HR15ET (manufactured by Toyobo Co., Ltd.) was used as a base was applied on the whole area of double sides of the substrate by means of a screen printing method using a printing plate of #200 mesh made of stainless steel so as to make the film thickness 10 μm followed by drying at 80° C. for 5 minutes, 150° C. for 1 hour and 180° C. for 20 minutes.

The transmittance of the non-circuit area of the resulting flexible printed circuit board was 80% showing a good colorless transparency.

Comparative Example 6

The same operation as in Example 12 was carried out except that the ink for a cover coating was changed to a cover coat ink AS 710 (aromatic amideimide resin type) manufactured by Toyobo Co., Ltd. whereupon a flexible printed circuit board was prepared. Transmittance of the non-circuit area of the resulting flexible printed circuit board was colored in yellowish brown.

Example 13

An adhesive of a polyester urethane type (KW manufactured by Toyobo Co., Ltd.) was applied on the polyamideimide film prepared in Example 1 using a comma coater so as to make the thickness after drying 15 μm followed by drying at 80° C. for 3 minutes and 150° C. for 3 minutes to prepare a film having an adhesive.

After that, double sides of the substrate of the flexible double sided metal-clad laminate of Example 9 were subjected to a circuit processing by the same method as in Example 12 and the circuit sides (double sides) of the resulting substrate were laminated with the adhesive side of the above film having an adhesive each other followed by subjecting to a press lamination (160° C. for 4 minutes, pressure was 20 Kgf/cm² (196.138 N/cm²)) and an after-curing (100° C. for 16 hours) whereupon a flexible printed circuit board where double sides were subjected to a cover-lay processing was prepared.

The transmittance of the non-circuit area of the resulting flexible printed circuit board was 85% showing a good colorless transparency.

Comparative Example 7

The same operation as in Example 13 was carried out except that a commercially available aromatic polyimide film (APICAL NPI manufactured by Kaneka Corporation) of 12.5 μm was used instead of the polyamideimide film used for the manufacture of a film having an adhesive whereupon a flexible printed circuit board where double sides were subjected to a cover-lay processing was prepared. Light transmittance of the non-circuit area of the resulting circuit board was 20% and a satisfactory colorless transparency could not be achieved.

Industrial Applicability

As described above, according to the present invention, it is possible to manufacture a flexible metal-clad laminate having excellent heat resistance, flexibility and low thermal expansion together with sufficient colorless transparency and a colorless and transparent flexible printed circuit board using the same at low cost. They can be used in a broad area such as electronic instruments. They are particularly advantageous as a transparent film substrate used, for example, in liquid display.

What is claimed is:

1. A polyamideimide resin, comprising structures represented by the following formulae (2) and (4a) or structures represented by the following formulae (2) and (6):

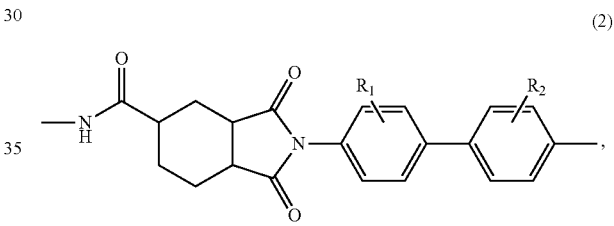

(2)

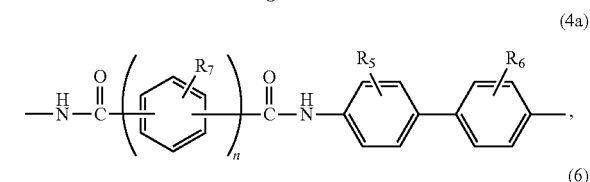

(4a)

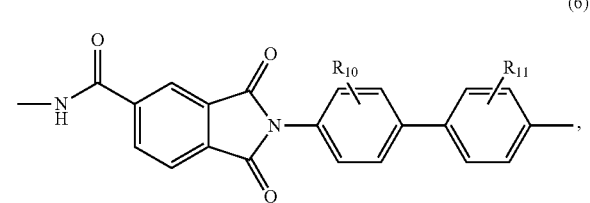

(6)

wherein
each of $R_1$ and $R_2$ is an alkyl group having 1 to 3 carbon(s);
each of $R_5$ and $R_6$ is hydrogen, or an alkyl group having 1 to 3 carbon(s);
$R_7$ is hydrogen, or an alkyl group having 1 to 3 carbon(s);
n is an integer of 1 to 3;
each of $R_{10}$ and $R_{11}$ is hydrogen, or an alkyl group having 1 to 3 carbon(s);
the ratio of (unit represented by the formula (2))/(unit represented by the formula (4a)) is within a range of 99.9/0.1 to 50/50;
the ratio of (unit represented by the formula (2))/(unit represented by the formula (6)) is within a range of 99.9/0.1 to 50/50; and the polyamideimide resin has an inherent viscosity of from 0.8 dl/g to 2.5 dl/g.

2. The polyamideimide resin according to claim 1, wherein the resin comprises structures represented by formulae (2) and (4a).

3. The polyamideimide resin according to claim 2, wherein each of $R_1$ and $R_2$ is methyl.

4. The polyamideimide resin according to claim 3, wherein each of $R_5$ and $R_6$ is methyl.

5. The polyamideimide resin according to claim 4, wherein n is 1 or 2.

6. The polyamideimide resin according to claim 5, wherein $R_7$ is hydrogen.

7. The polyamideimide resin according to claim 1, wherein the resin comprises structures represented by formulae (2) and (6).

8. The polyamideimide resin according to claim 7, wherein each of $R_1$, $R_2$, $R_{10}$, and $R_{11}$ is methyl.

9. The polyamideimide resin according to any one of claim 2 or 7, wherein the glass transition temperature of the polyamideimide resin is not lower than 250° C. and, when said polyamideimide resin is made into a film whose thickness upon drying is 12.5 μm, a light transmittance of the film at the wavelength of 500 nm is not less than 80% and a linear expansion coefficient thereof is not more than 40 ppm/K.

10. The polyamideimide resin according to claim 1, wherein the glass transition temperature of the polyamideimide resin is not lower than 250° C. and, when said polyamideimide resin is made into a film whose thickness upon drying is 12.5 μm, a light transmittance of the film at the wavelength of 500 nm is not less than 80% and a linear expansion coefficient thereof is not more than 40 ppm/K.

11. A colorless and transparent polyamideimide film prepared by using the polyamideimide resin according to claim 1.

12. A colorless and transparent flexible metal-clad laminate, wherein a metal foil is directly laminated or is laminated via an adhesive layer on at least one side of the polyamideimide resin according to claim 1.

13. A colorless and transparent flexible printed circuit board prepared by using the flexible metal-clad laminate according to claim 12.

14. The colorless and transparent flexible printed circuit board according to claim 13 prepared by using the polyamideimide resin as a cover-lay material.

15. The colorless and transparent flexible printed circuit board according to claim 14, wherein the light transmittance of the non-circuit area after a cover-lay material laminating process at the wavelength of 500 nm is not less than 50%.

16. The colorless and transparent flexible printed circuit board according to claim 13 prepared by using a colorless and transparent polyamideimide film prepared from the polyamideimide resin as a cover-lay film.

17. The polyamideimide resin according to claim 1, wherein the inherent viscosity is from 0.9 dl/g to 2.3 dl/g.

18. The polyamideimide resin according to claim 1, wherein the inherent viscosity is from 1.0 dl/g to 2.0 dl/g.

* * * * *